US012771328B2

(12) United States Patent
Woo

(10) Patent No.: US 12,771,328 B2
(45) Date of Patent: Oct. 20, 2026

(54) CAPACITANCE MULTIPLIER FOR DECOUPLING CAPACITOR

(71) Applicant: Apple Inc., Cupertino, CA (US)

(72) Inventor: Sang Hyun Woo, Austin, TX (US)

( * ) Notice: Subject to any disclaimer, the term of this patent is extended or adjusted under 35 U.S.C. 154(b) by 136 days.

(21) Appl. No.: 18/466,708

(22) Filed: Sep. 13, 2023

(65) Prior Publication Data

US 2023/0421136 A1 Dec. 28, 2023

Related U.S. Application Data

(63) Continuation of application No. 17/574,895, filed on Jan. 13, 2022, now Pat. No. 12,592,681.

(51) Int. Cl.

*H03H 11/48* (2006.01)
*H03F 1/56* (2006.01)
*H03H 11/40* (2006.01)

(52) U.S. Cl.

CPC ............. *H03H 11/483* (2013.01); *H03F 1/56* (2013.01); *H03H 11/405* (2013.01)

(58) Field of Classification Search

CPC ........ H03H 11/483; H03H 11/405; H03F 1/56
See application file for complete search history.

(56) References Cited

U.S. PATENT DOCUMENTS 5,327,027 A * 7/1994 Taylor .................. H03H 11/405 330/109
5,408,174 A * 4/1995 Leonowich ............. G05F 3/262 323/907

(Continued)

FOREIGN PATENT DOCUMENTS

CN 1457147 A 11/2003
CN 1988378 A 6/2007

(Continued)

OTHER PUBLICATIONS

Keliu Shu et al., A 2.4-GHz Monolithic Fractional-N Frequency Synthesizer With Robust Phase-Switching Prescaler and Loop Capacitance Multiplier, IEEE Journal of Solid-State Circuits, Jun. 2003, pp. 866-874, vol. 38, No. 6.
Gabriel Bonteanu, A Review of Capacitance Multiplication Techniques, Fundamentals of Electronics Department, Jun. 2018, pp. 1-6, IEEE.
Bill Reeve, The Capacitance Multiplier, https://audioxpress.com/article/the-capacitance-multiplier, Feb. 17, 2021.

(Continued)

*Primary Examiner* — Menatoallah Youssef
*Assistant Examiner* — Khareem E Almo
(74) *Attorney, Agent, or Firm* — Treyz Law Group; Jason Tsai

(57) ABSTRACT

An integrated circuit may include one or more circuits coupled to capacitance multiplier circuitry. The capacitance multiplier circuitry may include a capacitor, fixed and tunable resistances, and a transconductance circuit. The tunable resistance can be adjusted to control the overall capacitance of the capacitance multiplier circuitry. The transconductance circuit may include a transistor having a drain terminal coupled to a first electrical component and a source terminal coupled to a second electrical component. The first electrical component may be a diode-connected transistor, a direct shorting wire, a resistor, an inductor, or a current source. The second electrical component may be a current source, a direct shorting wire, a resistor, an inductor, or another diode-connected device. Configured in this way, the capacitance multiplier circuitry can provide a large adjustable amount of capacitance without a voltage drop and without consuming a large amount of power.

20 Claims, 11 Drawing Sheets

(56) References Cited

U.S. PATENT DOCUMENTS

| | | | | |
|---|---|---|---|---|
| 6,778,004 | B1 | 8/2004 | Jackson | |
| 7,652,524 | B2 * | 1/2010 | Patent | G05F 3/262 327/539 |
| 8,648,641 | B2 * | 2/2014 | Zha | H03L 5/00 333/81 R |
| 2004/0239430 | A1 * | 12/2004 | Cosentino | H03F 1/223 330/311 |
| 2009/0237143 | A1 * | 9/2009 | Sengupta | H03H 11/483 327/552 |
| 2014/0028416 | A1 | 1/2014 | Kimura et al. | |
| 2015/0318782 | A1 * | 11/2015 | Wang | H02M 3/07 327/536 |
| 2016/0013614 | A1 * | 1/2016 | Moto | H01S 5/0427 372/38.02 |

FOREIGN PATENT DOCUMENTS

| | | | |
|---|---|---|---|
| CN | 103580636 | A | 2/2014 |
| GB | 1001266 | A | 8/1965 |
| GB | 2143697 | A | 2/1985 |

OTHER PUBLICATIONS

Cadence PCB Solutions, Designing a Capacitance Multiplier as a Power Supply Filter, https://resources.pcb.cadence.com/blog/2019-designing-a-capacitance-multiplier-as-a-power-supply-filter, Date accessed: Jan. 12, 2022.

Jie Gu et al., "Design and Implementation of Active Decoupling Capacitor Circuits for Power Supply Regulation in Digital ICs", IEEE Transactions on Very Large Scale Integration (VLSI) Systems, Feb. 2009, pp. 292-301, vol. 17, No. 2, IEEE, New York, NY.

* cited by examiner

CAPACITANCE MULTIPLIER FOR DECOUPLING CAPACITOR

This application is a continuation of patent application Ser. No. 17/574,895, filed Jan. 13, 2022, which is hereby incorporated by reference herein in its entirety.

FIELD

Embodiments described herein relate generally to integrated circuits and, more particularly, to integrated circuits with capacitance multiplier circuitry.

BACKGROUND

Integrated circuits often include decoupling capacitance for reducing power supply noise for a circuit of interest. Decoupling capacitors shunt noise on direct current (DC) power supply lines and helps prevent the noise from reaching the powered circuit components. Decoupling capacitance with greater capacitance values can provide better noise suppression but at the cost of larger circuit area. To help provide large capacitance within a small layout area, decoupling capacitance is sometimes implemented as a capacitance multiplier circuit.

Capacitance multiplier circuits can be challenging to design. Conventional capacitance multiplier circuits have an input and an output and typically have a voltage drop from the input to the output, which makes them unsuitable for low voltage applications. Conventional capacitance multiplier circuits typically have capacitance values that are fixed, require the powered circuit of interest to have high impedance, and also consume large amounts of power. It is within this context that the embodiments herein arise.

SUMMARY

An electronic device may include an integrated circuit having one or more circuits coupled to power supply lines. The integrated circuit may be provided with decoupling capacitance circuitry to help suppress noise on the power supply lines. The decoupling capacitance circuitry may be implemented using a capacitance multiplier configuration to minimize the circuit area of the decoupling capacitance circuitry. Decoupling capacitance circuitry implementing capacitance multiplication is sometimes referred to as decoupling capacitance multiplier circuitry or capacitance multiplier circuitry.

An aspect of the disclosure provides an integrated circuit that includes a circuit coupled to a power supply line and capacitance multiplier circuitry coupled to the power supply line. The capacitance multiplier circuitry can include a capacitor having a first terminal coupled to the power supply line and having a second terminal, an adjustable resistance having a first terminal coupled to the second terminal of the capacitor and having a second terminal, and a transconductance circuit coupled to the capacitor and the adjustable resistance. The capacitance multiplier circuitry can optionally include: a first resistor having a first terminal coupled to the power supply line and having a second terminal coupled to second terminal of the adjustable resistance; a second resistor having a first terminal coupled to the second terminal of the adjustable resistance and having a second terminal coupled to a ground line; and a transistor having a gate terminal coupled to the second terminal of the capacitor, a first source-drain terminal coupled to the power supply line, and second source-drain terminal coupled to a ground line.

The transconductance circuit can include a current source coupled between the second source-drain terminal of the transistor and the ground line and an additional transistor having a first source-drain terminal coupled to the first source-drain terminal of the transistor, a gate terminal coupled to its first source-drain terminal, and a second source-drain terminal coupled to the power supply line. In another embodiment, the first source-drain terminal of the transistor can be directly coupled to the power supply line. The second source-drain terminal of the transistor can also be directly coupled to the ground line. The capacitance multiplier circuitry has a capacitance value that can be elevated by increasing a resistance value of the adjustable resistance. The capacitance multiplier circuitry has an overall capacitance value that is more than a hundred times greater than the capacitance value of the capacitor. The overall capacitance is sometimes referred to as the multiplied capacitance value.

An aspect of the disclosure provides capacitance multiplier circuitry that includes: a capacitor having a first terminal coupled to a positive power supply line and having a second terminal; an adjustable resistance coupled to the second terminal of the capacitor; and a transistor having a gate terminal coupled to the second terminal of the capacitor, a first source-drain terminal coupled to the positive power supply line, and a second source-drain terminal coupled to a ground power supply line. The capacitance multiplier circuitry can further include a first resistor having a first terminal coupled to the positive power supply line and having a second terminal coupled to the adjustable resistance, and a second resistor having a first terminal coupled to the adjustable resistance and having a second terminal coupled to the ground power supply line. The capacitance multiplier circuitry can include an electrical component coupled between the positive power supply line and the first source-drain terminal of the transistor, the electrical component being a component selected from the group consisting of: a diode-connected transistor, a resistor, and an inductor. The capacitance multiplier circuitry can include another electrical component coupled between the second source-drain terminal of the transistor and the ground power supply line, the another electrical component being a component selected from the group consisting of: a current source, a resistor, and an inductor.

An aspect of the disclosure provides capacitance multiplier circuitry that includes: a capacitor having a first terminal and having a second terminal that is coupled to a ground power supply line; an adjustable resistance coupled to the first terminal of the capacitor; and a transistor having a gate terminal coupled to the first terminal of the capacitor, a first source-drain terminal coupled to a positive power supply line, and a second source-drain terminal coupled to the ground power supply line. The capacitance multiplier circuitry can further include a first resistor having a first terminal coupled to the positive power supply line and having a second terminal coupled to the adjustable resistance, and a second resistor having a first terminal coupled to the adjustable resistance and having a second terminal coupled to the ground power supply line. The capacitance multiplier circuitry can further include an electrical component coupled to at least one of the first and second source-drain terminals of the transistor, the electrical component being a component selected from the group consisting of: a diode-connected transistor, a current source, a resistor, and an inductor.

Further features of the invention, its nature and various advantages will be more apparent from the accompanying drawings and following detailed description.

DETAILED DESCRIPTION

This relates to an integrated circuit having capacitance multiplier circuitry coupled to a circuit of interest. Such integrated circuit can be included within any type of electronic device or system, including but not limited to a cellular telephone, a tablet computer, a wristwatch, a laptop computer, a desktop computer, a monitor, a display with one or more displays, a media player, a digital content streaming device, a charger, an earbud, a headphone, a speaker, a stylus, a keyboard, an accessory, a wearable device, a head-mounted device, an automobile, or other electronic systems. The capacitance multiplier circuitry may be used as decoupling capacitance to suppress power supply noise and can thus sometimes be referred to as decoupling capacitance multiplier circuitry.

The capacitance multiplier circuitry may include a capacitor, a tunable resistor, and a transconductance circuit. The tunable resistor may be adjusted to control the capacitance value of the capacitance multiplier circuitry. The transconductance circuit may include a transistor having a first source-drain terminal coupled to a first electrical (load) component and having a second source-drain terminal coupled to a second electrical (load) component. The first electrical component can be a diode-connected transistor, a resistor, an inductor, or can be entirely omitted. The second electrical component can be a current source, a resistor, an inductor, or can be entirely omitted. Configured in this way, the capacitance multiplier circuitry can provide a large adjustable amount of capacitance without voltage drop, without requiring the circuit of interest to have high impedance, and without consuming a large amount of power.

Figure 1:
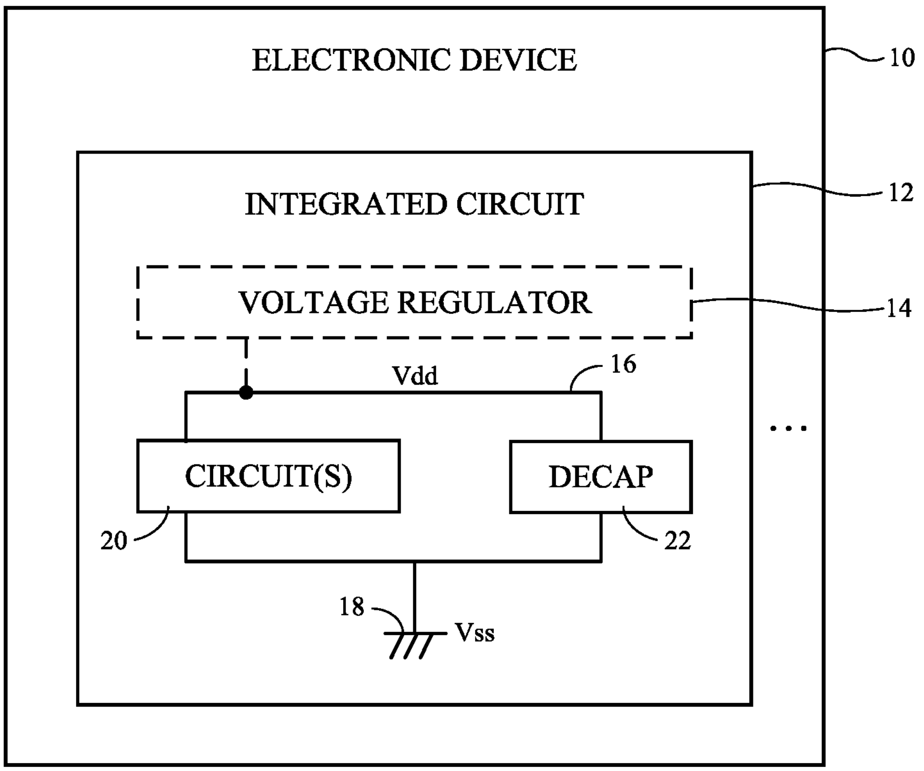
FIG. 1 is a diagram of an illustrative integrated circuit die that includes a circuit coupled to a decoupling capacitance in accordance with some embodiments.

FIG. 1 is a diagram of an electronic device such as electronic device 10 that can be provided with such decoupling capacitance multiplier circuitry. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include an integrated circuit 12. Integrated circuit 12 can be a microprocessor, a microcontroller, a digital signal processor, a host processor, a baseband processor, an application processor, a central processing unit (CPU), a graphics processing unit (GPU), a field-programmable gate array or programmable logic device, a sound (audio) chip, a wireless communications processor such as a radio-frequency transceiver chip, or other types of integrated circuits.

Integrated circuit 12 may include one or more circuits of interest such as circuit(s) 20 coupled between a positive power supply line 16 and a ground power supply line 18. A positive power supply voltage Vdd may be provided on power supply line 16 using an optional voltage regulator 14, a power management circuit, or other power regulation circuit. Circuit(s) 20 can sometimes be referred to as a circuit under test (CUT) or device under test (DUT). A ground power supply voltage Vss may be provided on ground line 18. Voltage regulator 14 are often used to maintain a constant voltage level for Vdd. Voltage regulator 14, however, is sometimes not included and might not always be effective at suppressing power supply noise. Integrated circuit 12 can therefore be provided with decoupling capacitance circuitry 22 (sometimes referred to as "decap" circuitry) that is configured to reduce or suppress the amount of power supply noise that may be present on the power supply lines. FIG. 1 shows decoupling capacitance circuitry 22 being shunted between from positive power supply line 16 to the ground line 18.

To provide improved power supply noise suppression, it is generally desirable for decoupling capacitance circuitry 22 to have a higher capacitance value. Higher capacitance, however, typically requires larger circuit layout area. To help provide high capacitance without requiring substantial circuit footprint, decoupling capacitance circuitry 22 can be implemented using a capacitance multiplier configuration. A capacitance multiplier based decoupling capacitance is sometimes referred to as decoupling capacitance multiplier circuitry.

Figure 2:
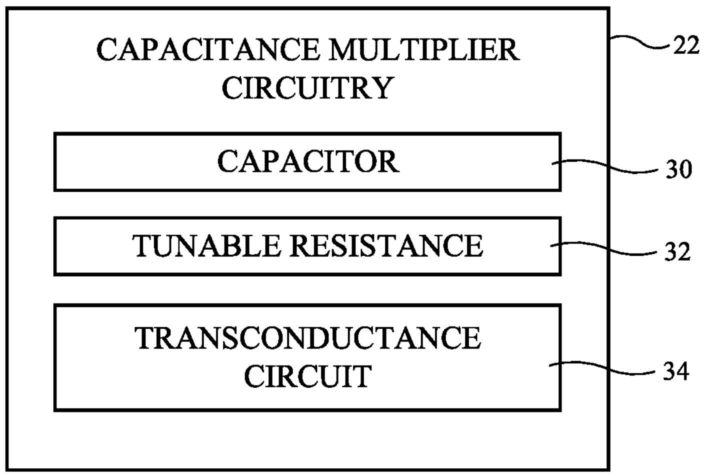
FIG. 2 is a block diagram of illustrative capacitance multiplier circuitry in accordance with some embodiments.

FIG. 2 is a block diagram of capacitance multiplier circuitry 22. As shown in FIG. 2, capacitance multiplier circuitry 22 may include a capacitor such as capacitor 30, a tunable resistor such as tunable resistance 32, and a transconductance circuit such as transconductance circuit 34. Capacitance multiplier circuitry 22 may include only one capacitor (i.e., a single capacitor 30). Capacitor 30 may be directly coupled to the power supply line or directly coupled to the ground power supply line.

Tunable resistance 32 may be adjusted to control a multiplication factor of multiplier circuitry 22. For instance, increasing the value of resistance 32 may increase the effective/overall capacitance of circuitry 22, whereas decreasing the value of resistance 32 may decrease the effective/overall capacitance of circuitry 22. The effective (overall) capacitance of circuitry 22 may be equal to the nominal capacitance of capacitor 30 multiplied by the multiplication factor. The multiplication factor can be adjusted to be equal to two, three, four, 4-10, 10-20, 20-100, 100-200, 200-500, 500-1000, more than 1000, or other suitable values. The transconductance (Gm) of circuit 34 can also impact the multiplication factor and can include active and optionally passive circuit components.

Figure 3:
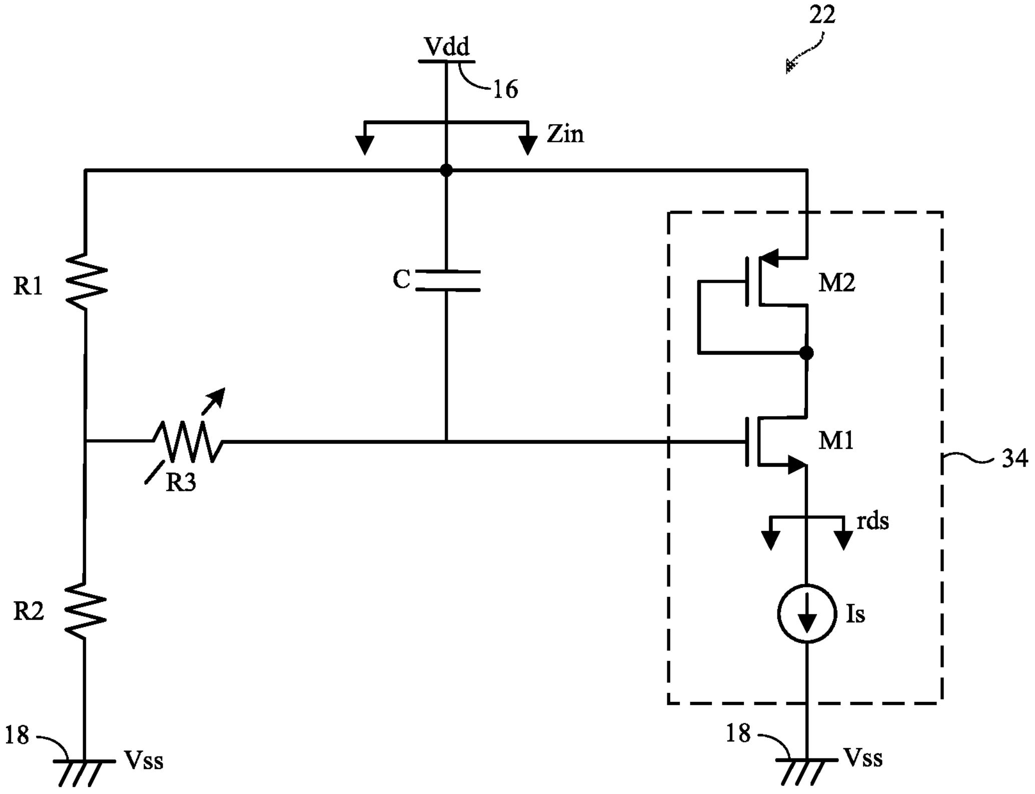
FIG. 3 is a circuit diagram showing one implementation of capacitance multiplier circuitry of the type shown in FIG. 2 in accordance with some embodiments.

FIG. 3 is a circuit diagram showing one implementation of capacitance multiplier circuitry 22 of the type shown in FIG. 2 in accordance with some embodiments. As shown in FIG. 3, capacitance multiplier circuitry 22 may include a capacitor C, resistors R1, R2, and R3, and transconductance circuit 34. Capacitor C in FIG. 3 may be equivalent to capacitor 30 in FIG. 2, and resistor R3 may be equivalent to tunable resistor 32 in FIG. 2. While resistor R3 is tunable (adjustable), resistors R1 and R2 can be fixed. If desired, resistors R1 and/or R2 can also be tunable.

Capacitor C may have a first terminal coupled to positive power supply line (terminal) 16 and a second terminal. Resistor R1 may have a first terminal coupled to power supply line 16 and a second terminal. Resistor R2 may have a first terminal coupled to the second terminal of resistor R1 and a second terminal coupled to ground line 18. Tunable resistor R3 may have a first terminal coupled to the second terminal of capacitor C and a second terminal coupled to the second terminal of resistor R1 (i.e., the second terminal of resistor R3 may be coupled to the node interposed between resistors R1 and R2).

In the example of FIG. 3, transconductance circuit 34 may include a first transistor M1 (e.g., an n-channel transistor such as an n-type metal-oxide-semiconductor device), a second transistor M2 (e.g., a p-channel transistor such as a p-type metal-oxide-semiconductor device), and a current source Is. Transistor M1 may have a gate terminal coupled to the second terminal of capacitor C, a drain terminal coupled to power supply line 16 via transistor M2, and a source terminal coupled to ground line 18 via current source Is. The terms "source" and "drain" terminals used to refer to current-conveying terminals in a transistor may be used interchangeably and are sometimes referred to as "source-drain" terminals. Thus, the drain terminal of transistor M1 can sometimes be referred to as a first source-drain terminal, and the source terminal of transistor M1 can be referred to as a second source-drain terminal (or vice versa).

Transistor M2 may have a source terminal coupled to power supply line 16, a gate terminal, and a drain terminal coupled to its gate terminal. Transistor M2 having its gate and drain terminals shorted together is sometimes referred to as being in a "diode-connected" configuration. Current source Is may be implemented using a current mirror circuit (as an example).

Configured in this way, capacitance multiplier circuitry 22 may have an input impedance Zin (looking into the first terminal of capacitor C) represented by the following expression:

$$Zin = \frac{(R1 + R2) + sC(R1 * R2 + R2 * R3 + R3 * R1)}{(1 + Gm * R2) * (1 + sC(R1 + R3))} \tag{1}$$

where C is the value of the capacitor and where Gm represents the overall transconductance of the circuit 34. Transconductance circuit 34 can be defined herein as a circuit having an output current that is controlled by an input voltage (e.g., the drain-to-source current flowing through transistor M1 is a function of the voltage level at the gate of transistor M1). Transconductance Gm of circuit 34 can be represented by the following equation:

$$Gm = \frac{gm1}{(1 + gm1 * rds)} \tag{2}$$

where gm1 represents the transconductance of transistor M1 and where rds represents the resistance of current source Is looking down from the source terminal of transistor M1 (see arrow in FIG. 3). At low operating frequencies and when the value of capacitor C is low, then equation 1 can be simplified to the following expression:

$$Zin \cong \frac{(R1 + R2)}{(1 + Gm * R2) * (1 + sC(R1 + R3))} \tag{3}$$

As shown in equation 3, the overall capacitance of circuitry 22 is equal to C multiplied by (1+Gm*R2*(R1+R3)/(R1+R2)).

Equation 3 is an approximation of the input impedance Zin for relatively low frequency values such as for operating frequencies of less than 1 MHz (megahertz), less than 10 MHz, less than 100 kHz (kilohertz), less than 10 kHz, less than 1 kHz, less than 100 Hz, less than 10 Hz, 0-Hz, 0-100 Hz, 0-1 kHz, 0-10 kHz, 0-100 kHz, 0-1 MHz, 0-10 MHz, etc. Circuitry 22 can thus provide very low impedance at relatively low frequency ranges, which can be useful for applications such as an audio system (as an example). Values of capacitor C can be relatively low to save circuit area and can be equal to or less than 10 pF (picofarad), equal to or less than 1 pF, equal to or less than 100 pF, equal to or less than 1 nF (nanofarad), 10-100 pF, 1-10 pF, 1-100 pF, 0.1-100 pF, 1-1000 pF, or other low capacitance values.

Configured in this way, capacitance multiplier circuitry 22 can multiply capacitance C by a factor of at least 2×, 3×, 2-10×, 20×, 10-20×, 20-100×, 100-200×, 100-1000×, 2-1000×, or more. As an example where capacitor C is 10 pF, tunable resistor R3 can be adjusted to a first value to produce an effective overall capacitance of 30 pF (e.g., to boost capacitance by 3×), to a second value to produce an effective overall capacitance of 200 pF (e.g., to boost capacitance by 20×), to a third value to produce an effective overall capacitance of 2 nF (e.g., to boost capacitance by 200×), or can be tuned to other desired values to produce the desired range of overall (multiplied) capacitance. The exemplary capacitance multiplier circuitry 22 of FIG. 3 can therefore be used to provide a wide tunable range of capacitance without consuming a large amount of circuit area, without consuming a substantial amount of power, and without having a voltage drop (which further enables application to lower power systems). The effective overall capacitance value of circuitry 22 is sometimes referred to as the multiplied capacitance value.

Figure 4:
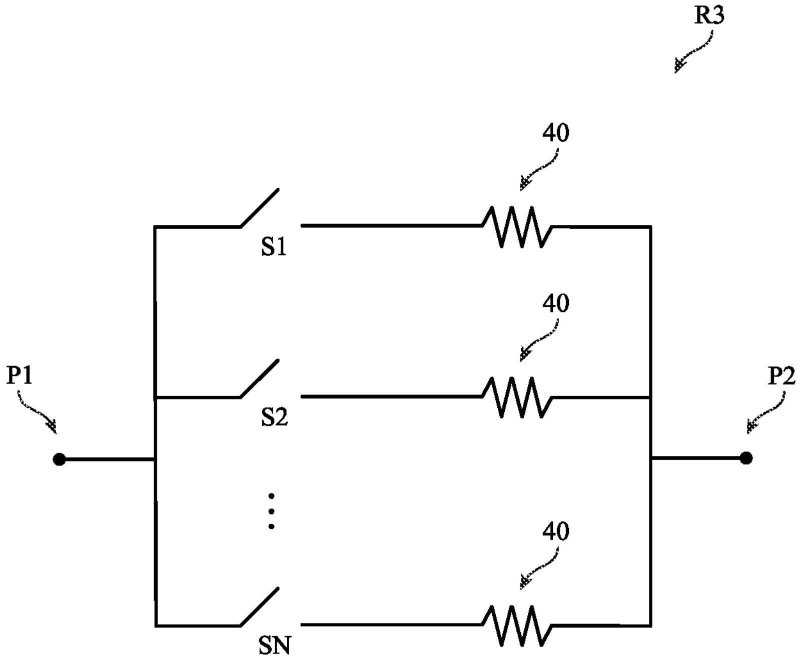
FIG. 4 is a circuit diagram of an illustrative tunable resistance in accordance with some embodiments.

FIG. 4 is a circuit diagram showing one implementation of tunable resistor R3 (sometimes referred to as a tunable resistance or a tunable resistor circuit). As shown in FIG. 4, tunable resistor R3 has a first terminal (port) P1, a second terminal (port) P2, and multiple resistors 40 switchably coupled between terminals P1 and P2. For instance, a first resistor 40 may be selectively activated using a first switch S1 (e.g., by turning on S1), a second resistor 40 may be selectively activated using a second switch S2 (e.g., by turning on S2), . . . , and an $N^{th}$ resistor 40 may be selectively activated using switch SN. Tunable resistance R3 may include any number of resistors 40 (e.g., N may be equal to at least three, four, 4-8, 8-16, 16-32, 32-64, 64-128, or other integer value). The values of resistors 40 may be the same or may be different. As an example, the values of resistors 40 can be binary weighted.

Figure 5:
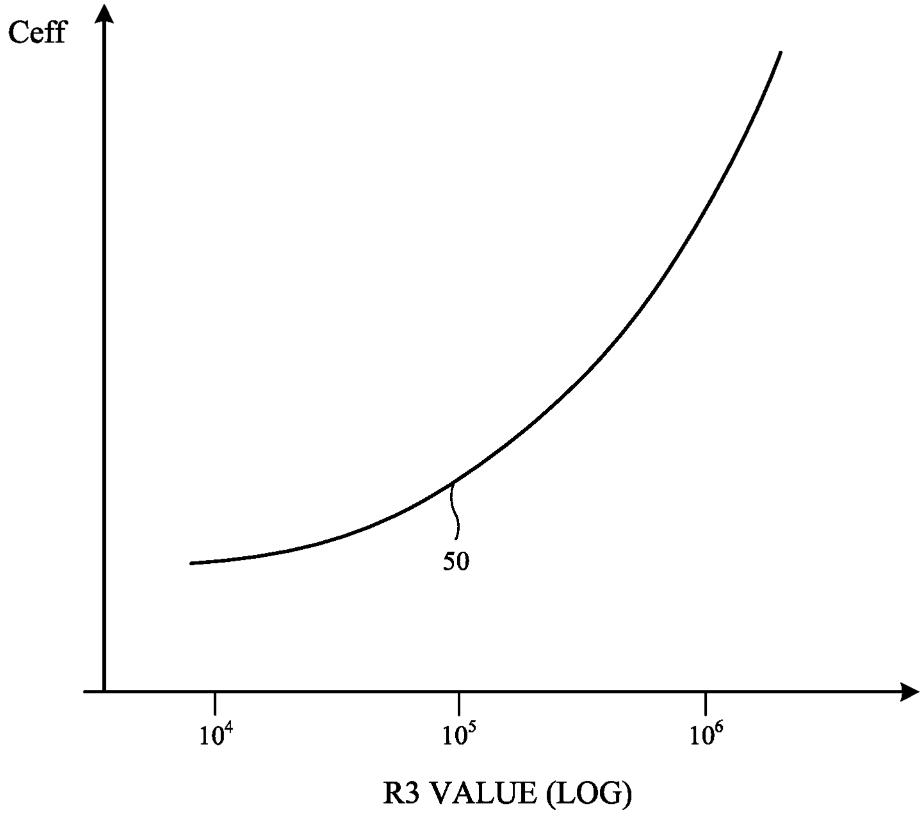
FIG. 5 is a diagram showing the multiplied capacitance as a function of the tunable resistance in accordance with some embodiments.

The effective overall capacitance (impedance) of capacitance multiplier circuitry 22 can be controlled by adjusting the value of tunable resistor R3. FIG. 5 is a diagram of curve 50 plotting the effective overall capacitance Ceff of circuitry 22 as a function of the resistance of R3. As shown by curve 50, the overall capacitance Ceff will increase as the value of the tunable resistance increases. A first subset of the resistors 40 within tunable resistance R3 (see FIG. 4) can be activated to provide a first resistance value corresponding to a first capacitance value. A second subset of the resistors 40 within tunable resistance R3, different than the first subset, can be activated to provide a second resistance value (greater than the first resistance value) corresponding to a second capacitance value that is greater than the first capacitance value. A third subset of the resistors 40 within tunable resistance R3, different than the first and second subsets, can be activated to provide a third resistance value (greater than the second resistance value) corresponding to a third capacitance value that is even greater than the second capacitance value, and so on. A wide range of capacitance values can be provided in this way.

Figure 6:
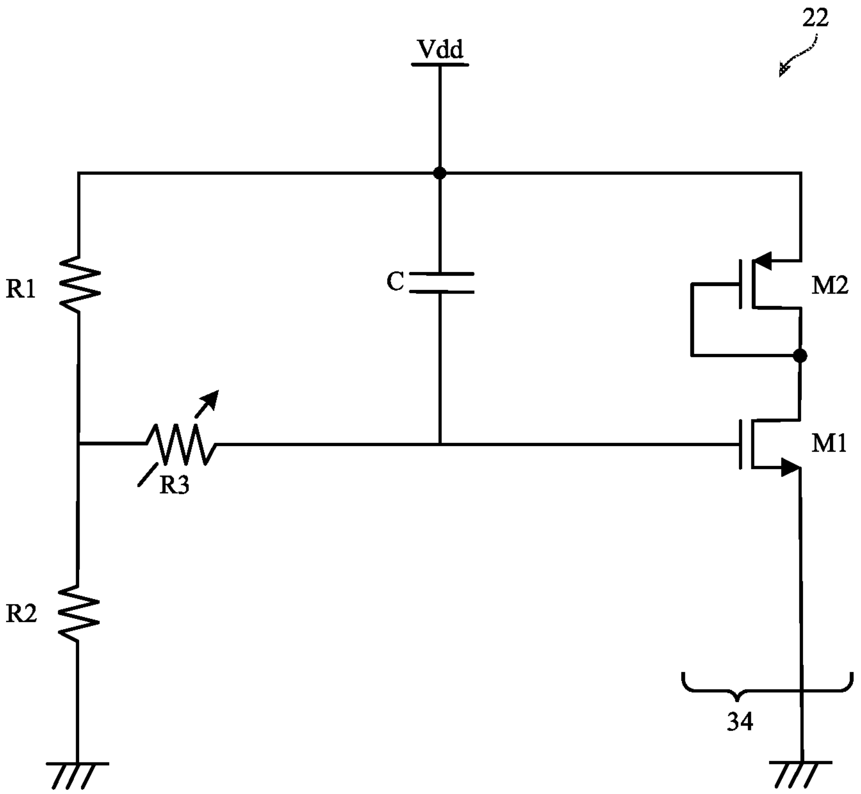
FIGS. 6-11 are diagrams showing different implementations of capacitance multiplier circuitry of the type shown in FIG. 2 in accordance with some embodiments.

The examples above where the effective capacitance of circuitry 22 is adjusted by controlling the value of tunable resistance R3 is merely illustrative. As shown in equation 3, the input impedance of circuitry 22 is also a function of Gm—the transconductance of circuit 34. The example of FIG. 3 in which transconductance circuit 34 includes transistor M1, transistor M2, and current source Is is merely illustrative. FIG. 6 shows another embodiment where transconductance circuit 34 includes only transistors M1 and M2, without any current source connected at the source terminal of transistor M1. As shown in FIG. 6, transistor M1 has a drain terminal coupled to the Vdd power supply line via diode-connected transistor M2 and has a source terminal directly coupled to the ground line. Transconductance circuit 34 of FIG. 6 lacking a current source increases the transconductance Gm of circuit 34, which provides an even higher capacitance multiplier factor while trading off for higher power consumption.

Figure 7:
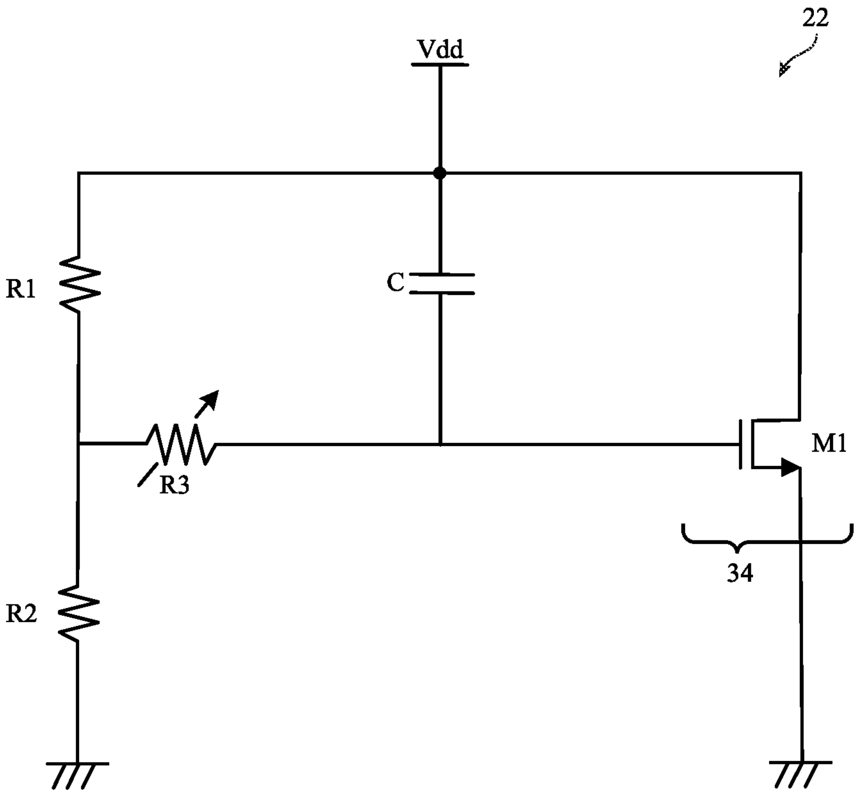

The example of FIG. 6 in which transconductance circuit 34 includes both transistors M1 and M2 is merely illustrative. FIG. 7 shows another embodiment where transconductance circuit 34 includes only transistor M1, without any current source connected at the source terminal of transistor M1 and without any diode-connected transistor M2 connected at the drain terminal of transistor M1. As shown in FIG. 7, transistor M1 has a drain terminal directly coupled to the Vdd power supply line and has a source terminal directly coupled to the ground line. Transconductance circuit 34 of FIG. 7 lacking a current source and a diode-connected transistor further increases the transconductance Gm of circuit 34, which provides an even higher capacitance multiplier factor while trading off for higher power consumption.

Figure 8:
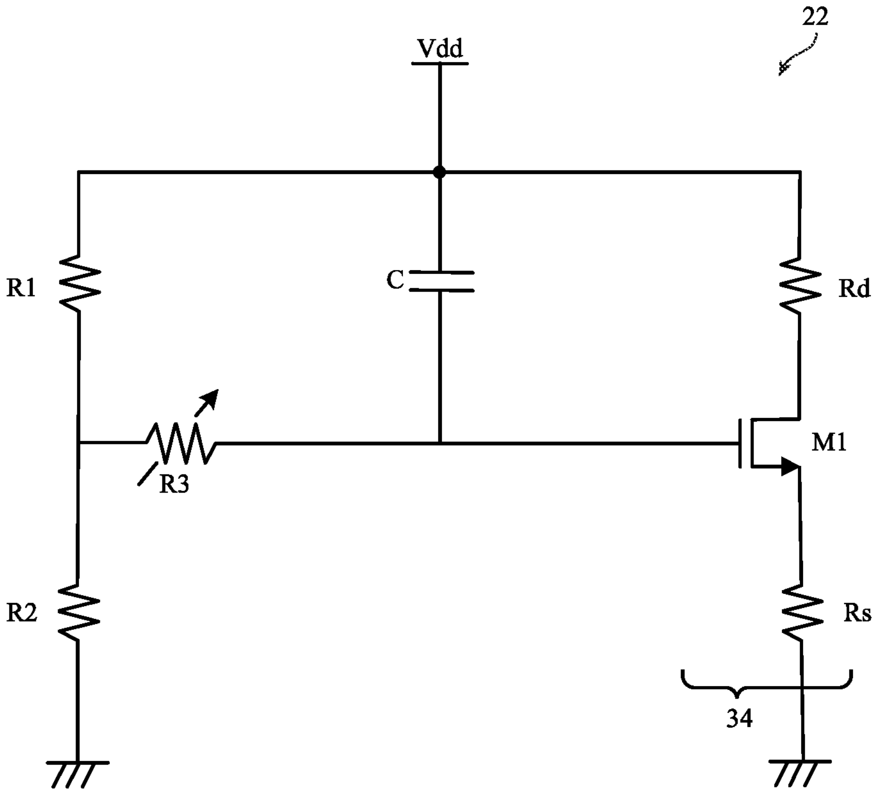

The example of FIG. 3 in which transconductance circuit 34 includes current source Is connected at the source terminal of transistor M1 and diode-connected transistor M2 connected at the drain terminal of transistor M1 is merely illustrative. FIG. 8 shows another embodiment where transconductance circuit 34 has a drain resistor Rd coupled between the drain terminal of M1 and the positive power supply line and has a source resistor Rs coupled between the source terminal of M1 and the ground power supply line. The values of resistors Rd and Rs can be adjusted to tune the transconductance Gm of circuit 34, which directly affects the capacitance multiplier factor to boost or reduce the overall effective capacitance of circuitry 22. If desired, resistor Rd and/or resistor Rs can have fixed resistance or adjustable resistance (see, e.g., the tunable resistance of FIG. 4).

Figure 9:
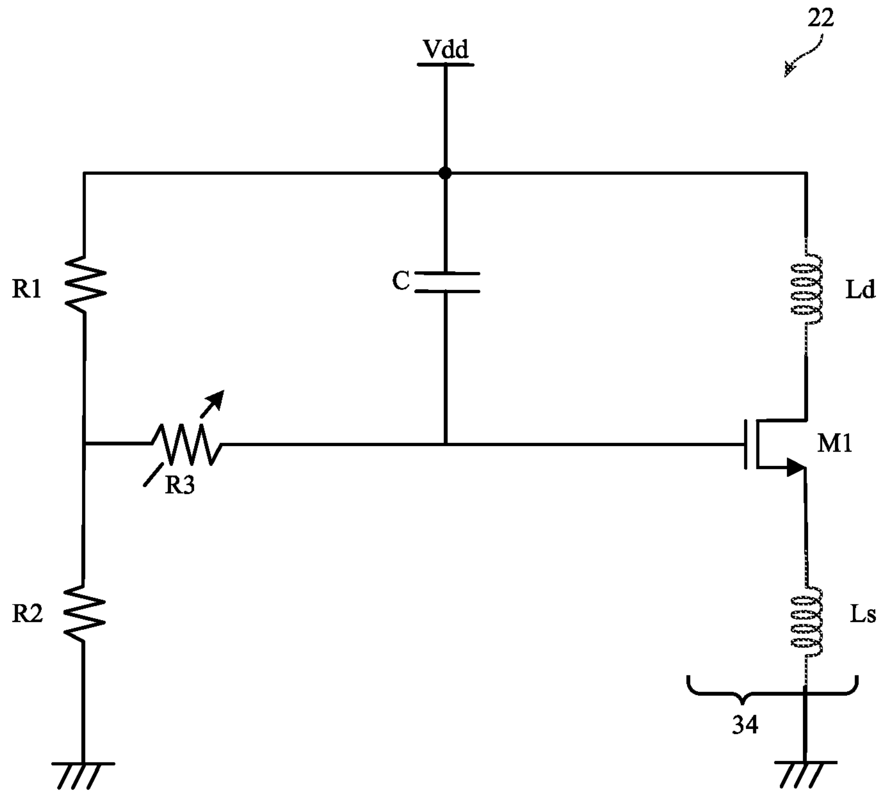

The example of FIG. 8 in which transconductance circuit 34 includes drain resistor Rd and source resistor Rs connected to the drain and source terminals of M1 is merely illustrative. FIG. 9 shows another embodiment where transconductance circuit 34 has a drain inductance Ld coupled between the drain terminal of M1 and the positive power supply line and has a source inductance Ls coupled between the source terminal of M1 and the ground power supply line. The values of inductors Ld and Ls can be adjusted to tune the transconductance Gm of circuit 34, which directly affects the capacitance multiplier factor to boost or reduce the overall effective capacitance of circuitry 22. If desired, inductor Ld and/or inductor Ls can have fixed inductance or adjustable inductance.

Figure 10:
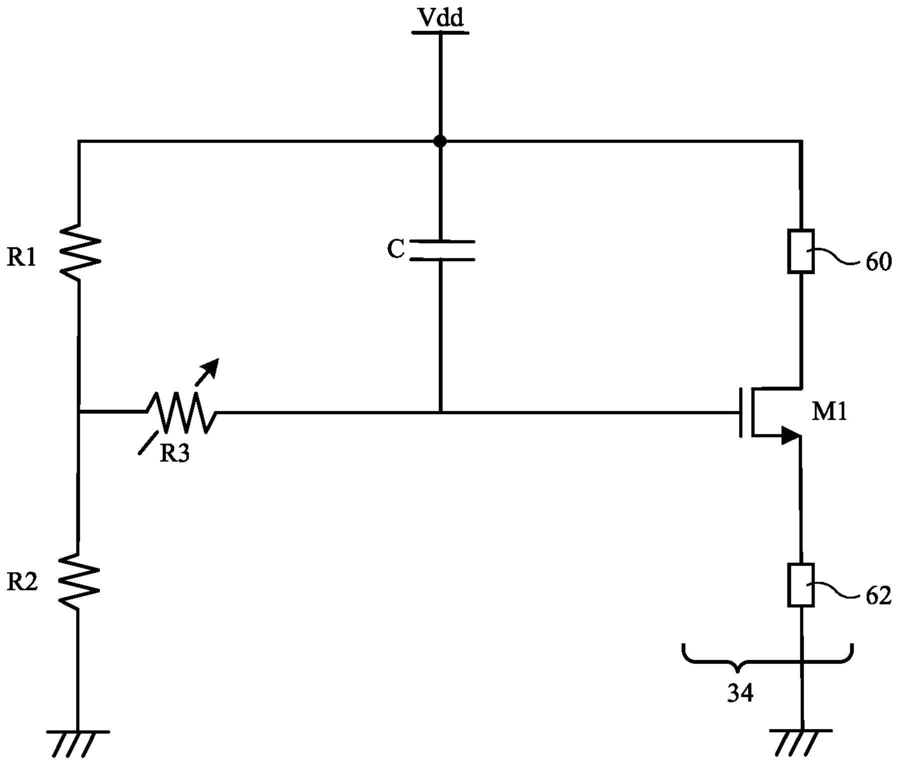

FIG. 10 shows another embodiment of capacitance multiplier circuitry 22 having transconductance circuit 34 with any desired electrical components coupled to the drain and source terminals of transistor M1. As shown in FIG. 10, transistor M1 may have a drain terminal coupled to the positive power supply line via a first electrical component 60 (sometimes referred to as a drain load component) and may have a source terminal coupled to the ground line via a second electrical component 62 (sometimes referred to as a source load component). Electrical component 60 can be a diode-connected PMOS transistor, a shorting wire that directly connects the drain terminal of M1 to the Vdd power supply line, a resistor, an inductor, or a current source. Electrical component 62 can be a current source, a shorting wire that directly connects the source terminal of M1 to the ground line, a resistor, an inductor, or a diode-connected NMOS transistor. Any hybrid combination of components 60 and 62 can be implemented (e.g., component 60 may be a resistor while component 62 can be an inductor, component 60 may be an inductor while component 62 can be a diode-connected NMOS, etc.).

Figure 11:
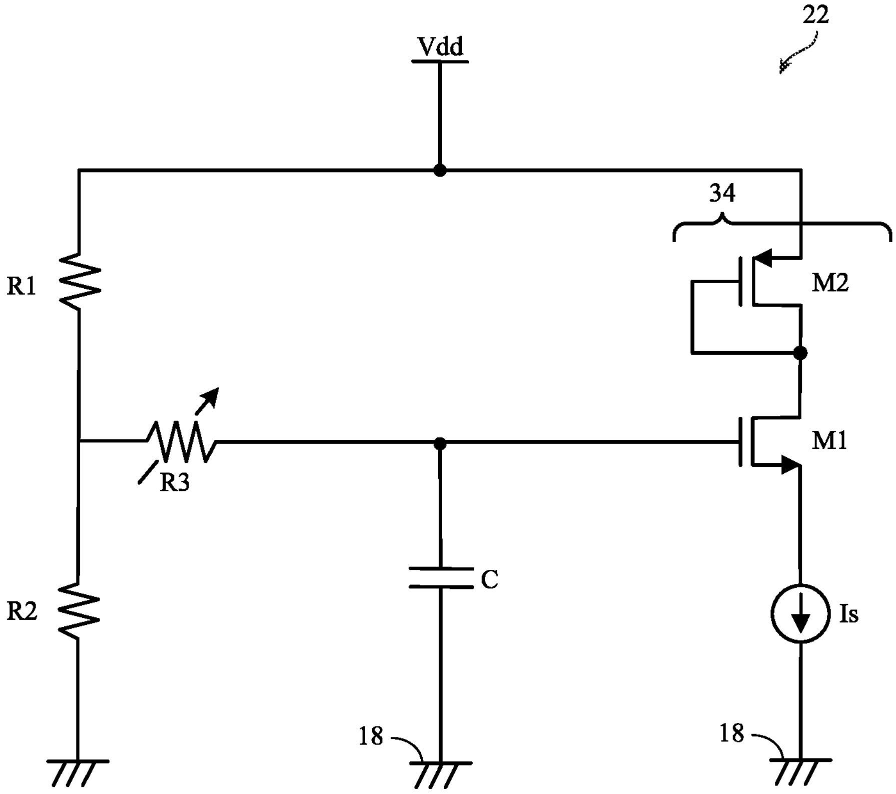

The examples of FIGS. 3 and 6-10 in which capacitor C is connected between the Vdd power supply line and the gate terminal of transistor M1 are merely illustrative. FIG. 11 shows another embodiment in which capacitor C is shunted to the ground line. As shown in FIG. 11, capacitor C has a first terminal coupled to the gate terminal of transistor M1 and a second terminal directly coupled to the ground line. The remaining structure and function of capacitance multiplier circuitry 22 are identical to FIG. 3 and need not be reiterated in detail to avoid obscuring the present embodiment. If desired, transconductance circuit 34 of FIG. 11 can also be varied (e.g., diode-connected transistor M2 can be replaced by a shorting wire that directly connects the drain terminal of M1 to the Vdd power supply line, a resistor, an inductor, or a current source, and/or current source Is can be replaced by a shorting wire that directly connects the source terminal of M1 to the ground line, a resistor, an inductor, or a diode-connected NMOS transistor).

The foregoing is merely illustrative and various modifications can be made to the described embodiments. The foregoing embodiments may be implemented individually or in any combination.

What is claimed is:

1. An integrated circuit comprising:

a circuit coupled to a positive power supply line; and capacitance multiplier circuitry configured to provide a decoupling capacitance for the circuit, the capacitance multiplier circuitry including a capacitor coupled to the positive power supply line and having a capacitance, the decoupling capacitance of the capacitance multiplier circuitry being more than two times the capacitance of the capacitor, a resistive chain coupled to the positive power supply line, and an adjustable resistor coupled between the capacitor and a node along the resistive chain.

2. The integrated circuit of claim 1, wherein the resistive chain comprises:

a first resistor having a first terminal coupled to the positive power supply line and having a second terminal directly connected to the adjustable resistor.

3. The integrated circuit of claim 2, wherein the resistive chain further comprises:

a second resistor having a first terminal directly connected to the adjustable resistor and having a second terminal coupled to a ground power supply line.

4. The integrated circuit of claim 1, wherein the capacitance multiplier circuitry further comprises:

a first transistor having a gate terminal directly connected to the capacitor, a first source-drain terminal coupled to the positive power supply line, and a second source-drain terminal coupled to a ground power supply line.

5. The integrated circuit of claim 4, wherein the capacitance multiplier circuitry further comprises:

a second transistor having a first source-drain terminal coupled to the positive power supply line, a second source-drain terminal coupled to the first transistor, and a gate terminal shorted to its second source-drain terminal.

6. The integrated circuit of claim 4, wherein the capacitance multiplier circuitry further comprises:

a current source coupled to the second source-drain terminal of the first transistor.

7. The integrated circuit of claim 4, wherein the second source-drain terminal of the first transistor is directly connected to the ground power supply line.

8. The integrated circuit of claim 4, wherein the first source-drain terminal of the first transistor is directed connected to the positive power supply line.

9. The integrated circuit of claim 4, wherein the capacitance multiplier circuitry further comprises:

a first resistor coupled between the positive power supply line and the first source-drain terminal of the first transistor; and a second resistor coupled between the second source-drain terminal of the first transistor and the ground power supply line.

10. The integrated circuit of claim 4, wherein the capacitance multiplier circuitry further comprises:

a first inductor coupled between the positive power supply line and the first source-drain terminal of the first transistor; and a second inductor coupled between the second source-drain terminal of the first transistor and the ground power supply line.

11. The integrated circuit of claim 1, wherein the adjustable resistor has an adjustable resistance that is increased to boost the decoupling capacitance of the capacitance multiplier circuitry.

12. The integrated circuit of claim 1, wherein the adjustable resistor comprises an array of resistors and switches.

13. An integrated circuit comprising:

a circuit coupled to a positive power supply line; and capacitance multiplier circuitry configured to provide a decoupling capacitance for the circuit, the capacitance multiplier circuitry including a capacitor coupled to the positive power supply line and having a capacitance, and a transistor having a gate terminal directly connected to the capacitor, wherein the decoupling capacitance of the capacitance multiplier circuitry is equal to the capacitance of the capacitor multiplied by a factor that is a function of a transconductance of the transistor.

14. The integrated circuit of claim 13, wherein the capacitance multiplier circuitry further comprises:

a first resistor having a first terminal coupled to the positive power supply line and having a second terminal coupled to the gate terminal of the transistor.

15. The integrated circuit of claim 14, wherein the capacitance multiplier circuitry further comprises:

a second resistor having a first terminal coupled to the first resistor and having a second terminal coupled to a ground power supply line.

16. The integrated circuit of claim 15, wherein the capacitance multiplier circuitry further comprises:

a third resistor having a first terminal coupled to a node between the first and second resistors and having a second terminal coupled to the gate terminal of the transistor.

17. The integrated circuit of claim 16, wherein the third resistor has an adjustable resistance that is increased to boost the decoupling capacitance of the capacitance multiplier circuitry.

18. The integrated circuit of claim 13, wherein the capacitance multiplier circuitry further comprises:

a first active or passive component coupled between the positive power supply line and a first source-drain terminal of the transistor.

19. The integrated circuit of claim 18, wherein the capacitance multiplier circuitry further comprises:

a second active or passive component coupled between a second source-drain terminal of the transistor and a ground power supply line.

20. An integrated circuit comprising:

a circuit coupled to a positive power supply line; and capacitance multiplier circuitry configured to provide a decoupling capacitance for the circuit, the capacitance multiplier circuitry including a capacitor having a first terminal and having a second terminal that is coupled to a ground power supply line, a first resistor coupled to the positive power supply line, a second resistor coupled between the first resistor and the ground power supply line, and a third resistor having a first terminal coupled to a node between the first and second resistors and having a second terminal coupled to the first terminal of the capacitor, wherein the third resistor has an adjustable resistance that is increased to raise the decoupling capacitance of the capacitance multiplier circuitry to a value equal to an integer multiple of a capacitance of the capacitor.

* * * * *